(12) United States Patent
Nicks et al.

(10) Patent No.: US 10,336,472 B2
(45) Date of Patent: Jul. 2, 2019

(54) MOTOR HEALTH MANAGEMENT APPARATUS AND METHOD

(71) Applicant: The Boeing Company, Chicago, IL (US)

(72) Inventors: Eric Lee Nicks, O'Fallon, MO (US); David Allan Followell, Wildwood, MO (US); Javier Cortez, Glen Carbon, IL (US)

(73) Assignee: The Boeing Company, Chicago, IL (US)

( * ) Notice: Subject to any disclaimer, the term of this patent is extended or adjusted under 35 U.S.C. 154(b) by 1095 days.

(21) Appl. No.: 14/515,045

(22) Filed: Oct. 15, 2014

(65) Prior Publication Data

US 2016/0107768 A1 Apr. 21, 2016

(51) Int. Cl.
| | | |
|---|---|---|
| *B64F 5/60* | (2017.01) | |
| *G01D 21/00* | (2006.01) | |
| *G01R 31/34* | (2006.01) | |
| *G05B 23/02* | (2006.01) | |
| *G05B 99/00* | (2006.01) | |
| *G06F 11/30* | (2006.01) | |

(Continued)

(52) U.S. Cl.
CPC ............ *B64F 5/60* (2017.01); *G05B 23/0221* (2013.01); *G05B 23/0283* (2013.01); *G01D 21/00* (2013.01); *G01R 31/34* (2013.01); *G05B 23/027* (2013.01); *G05B 23/0235* (2013.01); *G05B 99/00* (2013.01); *G06F 11/30* (2013.01); *G06F 17/40* (2013.01); *G06F 19/00* (2013.01)

(58) Field of Classification Search
CPC .................................................... B64F 5/0045
See application file for complete search history.

(56) References Cited

U.S. PATENT DOCUMENTS 2,883,255 A * 4/1959 Anderson ................ B41J 11/36
340/518
3,321,613 A * 5/1967 Searle .................... G07C 3/005
702/182

(Continued)

FOREIGN PATENT DOCUMENTS

| EP | 1669549 A1 | 6/2006 |
| FR | 2957170 A1 | 9/2011 |
| GB | 2494487 A | 3/2013 |

OTHER PUBLICATIONS

EuropeanSearch Report dated Mar. 9, 2016, regarding Application No. 15182640.1, 8 pages.

*Primary Examiner* — Manuel A Rivera Vargas
(74) *Attorney, Agent, or Firm* — Yee & Associates, P.C.

(57) ABSTRACT

A method and apparatus for managing health of a motor in an aircraft is presented. A first group of motor parameters and a second group of external bias parameters in sensor data received from a sensor system associated with the aircraft in which the first group of motor parameters is for an environment affected by operation of the motor in the aircraft and the second group of external bias parameters modifies an effect of the first motor group of motor parameters in identifying a health of the motor is monitored. The health of the motor is identified based on the first group of motor parameters and the second group of external bias parameters. An action is performed based on the health of the motor identified, wherein a controller enables increasing a confidence level in indicating the health of the motor.

18 Claims, 8 Drawing Sheets

(51) Int. Cl.
*G06F 17/40* (2006.01)
*G06F 19/00* (2018.01)

(56) References Cited

U.S. PATENT DOCUMENTS

| | | | | |
|---|---|---|---|---|
| 3,362,217 | A * | 1/1968 | Rush | G01K 3/04 |
| | | | | 374/E3.004 |
| 5,094,214 | A * | 3/1992 | Kotzan | F02D 41/1495 |
| | | | | 123/479 |
| 5,415,142 | A * | 5/1995 | Tsubakiji | F02D 11/107 |
| | | | | 123/336 |
| 7,187,796 | B1 * | 3/2007 | Phan | B82Y 10/00 |
| | | | | 250/492.3 |
| 8,437,904 | B2 | 5/2013 | Mansouri et al. | |
| 8,500,066 | B2 | 8/2013 | Lewis et al. | |
| 9,026,279 | B2 * | 5/2015 | Ziarno | G05B 23/0213 |
| | | | | 701/14 |
| 9,759,132 | B2 * | 9/2017 | Khalid | F02C 9/00 |
| 2008/0272915 | A1 * | 11/2008 | Day | G07C 3/00 |
| | | | | 340/572.1 |
| 2010/0138132 | A1 * | 6/2010 | Apps | G07C 3/08 |
| | | | | 701/100 |
| 2013/0066515 | A1 | 3/2013 | Sudolsky et al. | |
| 2013/0332011 | A1 * | 12/2013 | Ziarno | G05B 23/0213 |
| | | | | 701/3 |
| 2015/0088400 | A1 * | 3/2015 | Buhler | B60K 11/085 |
| | | | | 701/102 |
| 2015/0267619 | A1 * | 9/2015 | Khalid | B64C 11/305 |
| | | | | 701/100 |
| 2017/0211497 | A1 * | 7/2017 | Nakagawa | F02D 41/1495 |

* cited by examiner

MOTOR HEALTH MANAGEMENT APPARATUS AND METHOD

BACKGROUND INFORMATION

1. Field

The present disclosure relates generally to aircraft and, in particular, to motors used in aircraft. Still more particularly, the present disclosure relates to a method and apparatus for managing the health of a motor in an aircraft.

2. Background

Aircraft are assembled from many different parts. Commercial aircraft may have thousands of parts. These parts form systems in aircraft. The systems include flight surface control systems, engines, structural systems, flight entertainment systems, environmental systems, flight control systems, navigation computers, health management systems, and many other types of systems.

With the complexity of aircraft, health management is often performed to identify when maintenance may be needed for the aircraft. With health management, maintenance may be performed when necessary rather than based upon a schedule. With earlier maintenance, the cost of maintaining the aircraft may be reduced as compared to performing maintenance on a schedule that may result in more costly operations being performed on the aircraft. Additionally, health management systems may be used to initiate maintenance prior to a system failure that will cause a schedule interruption.

Health management systems may monitor various conditions during the operation of an aircraft. For example, sensors may be used to monitor temperatures, vibration, force, or other relevant conditions in an aircraft. This information is often sent to a computer in the health management system. The information from the sensors may be saved for later analysis or may be analyzed during the flight of the aircraft.

Currently, the management of motors in the aircraft may not be as accurate as desired. For example, a currently available health management system may not identify a condition that is a precursor of an undesired state of the motor. However, the undesired state of the motor may result in undesired conditions for the aircraft. For example, if a fan does not operate in the environmental system in the aircraft as desired, then the comfort level of the passengers in the cabin may not be as great as desired. Conditions such as motor wear, clogged air vents, wiring issues, out of balance rotation, dirty elements, or other conditions may result in the motor not operating as desired.

Current health management systems also may shut down the use of the motor if undesired vibrations caused from a loss or degradation of bearings in the motor occur or similar vibrations not related to the motor are detected. These vibrations may be detected through accelerometers or other vibration detectors. Currently used health management systems have a technical issue in which the confidence level in which an undesired operating condition is detected is not as high as desired. For example, currently used health management systems may generate false alarms or shut down the motor when the motor is not actually operating in an undesired manner.

Therefore, it would be desirable to have a method and apparatus that take into account at least some of the issues discussed above, as well as other possible issues. For example, it would be desirable to have a method and apparatus that detects when a motor is operating in an undesired condition with a higher level of confidence than currently available with currently used health management systems.

SUMMARY

In one illustrative embodiment, an apparatus comprises a sensor system for an aircraft, and a controller. The controller monitors a first group of motor parameters and a second group of external bias parameters in sensor data generated by the sensor system in which the first group of motor parameters is for an environment affected by operation of a motor in the aircraft and the second group of external bias parameters modifies an effect of the first group of motor parameters in identifying a health of the motor. The controller also identifies the health of the motor based on the first group of motor parameters and the second group of external bias parameters. The controller further performs an action based on the health of the motor identified. The controller enables increasing a confidence level in indicating the health of the motor.

In another illustrative embodiment, a method for managing health of a motor in an aircraft is presented. The process monitors a first group of motor parameters and a second group of external bias parameters in sensor data received from a sensor system associated with the aircraft. The first group of motor parameters is for an environment affected by operation of the motor in the aircraft and the second group of external bias parameters modifies an effect of the first motor group of motor parameters in identifying a health of the motor. The health of the motor is identified based on the first group of motor parameters and the second group of external bias parameters. An action is performed based on the health of the motor identified, wherein a controller enables increasing a confidence level in indicating the health of the motor.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that current health management systems typically compare sensor data from the sensor system to fixed thresholds in determining whether a motor is operating as desired. The illustrative embodiments recognize and take into account that fixed thresholds do not take into account the different phases of operation of the motor. For example, the motor may have different values for particular parameters during startup, steady-state, and shutdown phases of operation of the motor.

Further, the illustrative embodiments also recognize and take into account that currently used health management systems do not take into account other factors that may affect the parameters being monitored for the motor. For example, the illustrative embodiments recognize and take into account that the pressure in the environment may change during take-off, ascent, and cruising phases of flight of the aircraft. These differences in pressure may affect the parameters being monitored for the motor. For example, changes in pressure may affect the pressure at the output of the motor.

Thus, the illustrative embodiments provide a method and apparatus for a health management system in an aircraft. The health management system includes a sensor system and a controller. The sensor system is a sensor system for the aircraft. The controller monitors a first group of motor parameters and a second group of external bias parameters in sensor data generated by the sensor system. The first group of motor parameters is for the environment affected by the operation of a motor in the aircraft and the second group of external bias parameters modifies an effect the first group of motor parameters has in identifying the health of the motor. The controller identifies a health of the motor based on the first group of motor parameters and the second group of external bias parameters. The controller also may perform an action based on the health of the motor identified. In this manner, the controller enables increasing a confidence level in indicating a health of the motor.

As used herein, "a group of," when used with reference to items, means one or more items. For example, a first group of motor parameters is one or more motor parameters.

Figure 1:
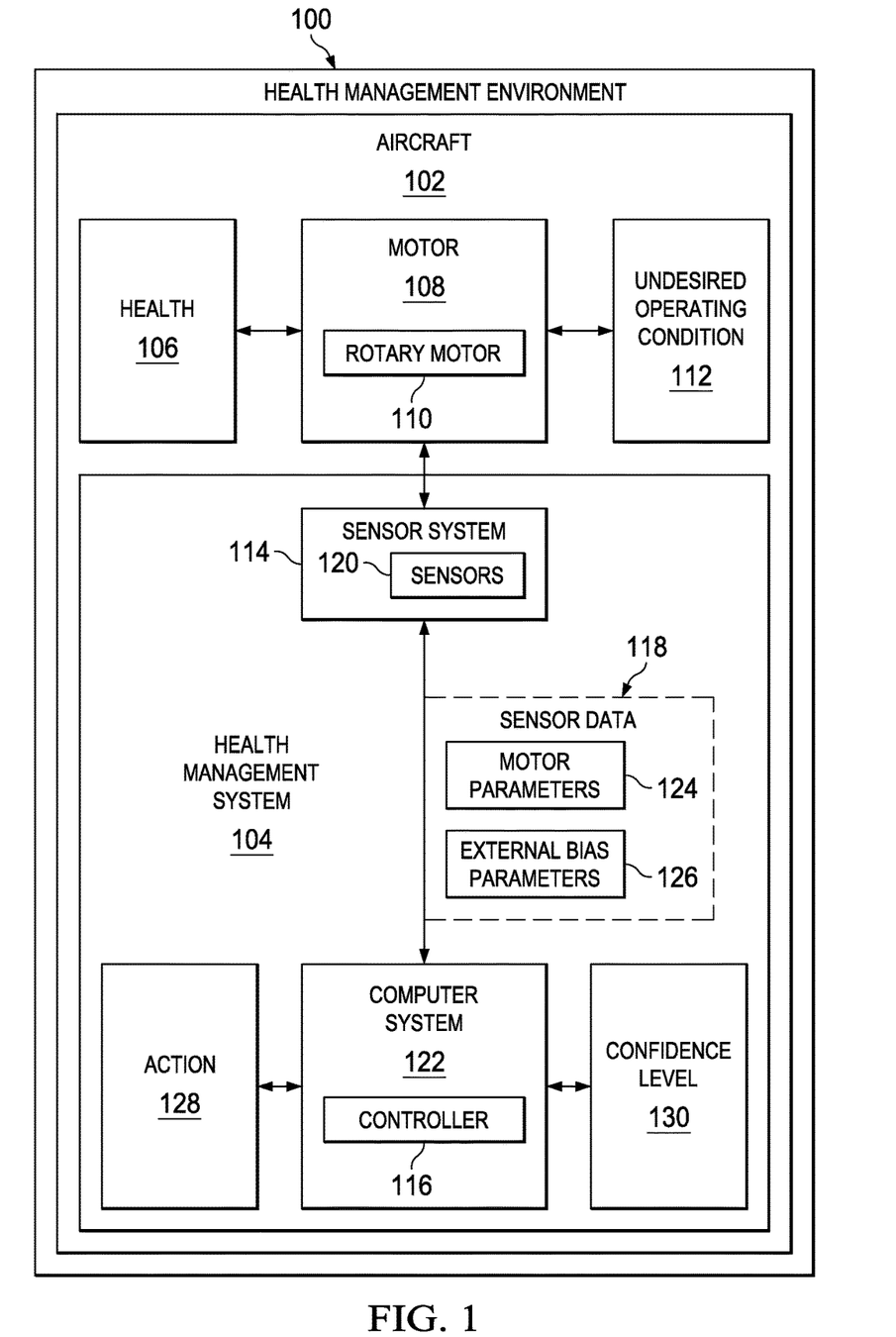
FIG. 1 is an illustration of a block diagram of a health management environment in accordance with an illustrative embodiment.

With reference now to the figures, and in particular, to FIG. 1, an illustration of a block diagram of a health management environment is depicted in accordance with an illustrative embodiment. In this illustrative example, health management environment 100 includes aircraft 102 with health management system 104.

Aircraft 102 may take various forms. For example, aircraft 102 may be selected from one of a commercial airplane, a military aircraft, a fuel tanker, a rotorcraft, a helicopter, or some other suitable type of aircraft.

Health management system 104 is associated with aircraft 102 and monitors health 106 of aircraft 102. When one component is "associated" with another component, the association is a physical association in the depicted examples. For example, a first component, health management system 104, may be considered to be physically associated with a second component, aircraft 102, by at least one of being secured to the second component, bonded to the second component, mounted to the second component, welded to the second component, fastened to the second component, or connected to the second component in some other suitable manner. The first component also may be connected to the second component using a third component. The first component may also be considered to be physically associated with the second component by being formed as part of the second component, extension of the second component, or both.

As used herein, the phrase "at least one of," when used with a list of items, means different combinations of one or more of the listed items may be used and only one of each item in the list may be needed. In other words, at least one of means any combination of items and number of items may be used from the list but not all of the items in the list are required. The item may be a particular object, thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

For example, health management system 104 may monitor motor 108 in aircraft 102. In this illustrative example, motor 108 is rotary motor 110. Rotary motor 110 generates rotational motion. Motor 108 may be selected from one of an electric motor, a fan, a pump, an actuator, a hydraulic motor, a pneumatic motor, or some other suitable type of motor.

Health management system 104 monitors health 106 for motor 108. Health 106 may include whether motor 108 has undesired operating condition 112. As depicted, motor 108 has undesired operating condition 112 when motor 108 does not perform as desired. In one illustrative example, motor 108 has undesired operating condition 112 when motor 108 performs with at least one of an undesired level of performance or motor 108 is unable to operate. For example, motor 108 may consume more current or electricity than desired. In another illustrative example, motor 108 may not generate as much pressure as desired. In the illustrative examples, the pressure is air pressure. In still another illustrative example, motor 108 has undesired operating condition 112 when motor 108 does not operate. In other words, motor 108 does not rotate, turn, or move.

In the illustrative example, health management system 104 may be comprised of a number of different components. As depicted, health management system 104 includes sensor system 114 and controller 116.

In the illustrative example, sensor system 114 is for aircraft 102. Sensor system 114 generates sensor data 118 using a group of sensors 120.

Sensors 120 in sensor system 114 may include all of the same type of sensors or different types of sensors. In the illustrative example, sensors 120 may be selected from at least one of a temperature sensor, an accelerometer, a pressure sensor, a microphone, a strain gauge, a voltage sensor, a torque sensor, a current sensor, or some other suitable type of sensor.

As depicted, sensors 120 may be implemented using existing sensors in aircraft 102. As a result, upgrades or refurbishments of existing aircraft may be unnecessary to implement health management system 104 to identify health 106 of motor 108. Further, the addition of additional sensors in sensors 120 may not be needed when designing aircraft 102.

In the illustrative example, controller 116 identifies health 106 of motor 108. Controller 116 may be implemented in software, hardware, firmware, or a combination thereof. When software is used, the operations performed by controller 116 may be implemented in program code configured to run on hardware, such as a processor unit. When firmware is used, the operations performed by controller 116 may be implemented in program code and data and stored in persistent memory to run on a processor unit. When hardware is employed, the hardware may include circuits that operate to perform the operations in controller 116.

In the illustrative examples, the hardware may take the form of a circuit system, an integrated circuit, an application-specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

Controller 116 may be implemented in computer system 122. Computer system 122 may be one or more data processing systems. When more than one data processing system is present, those data processing systems may be in communication with each other using a communications medium. The communications medium may be a network. The data processing systems may be selected from at least one of a computer, a server computer, a tablet, an electronic flight bag, a mobile phone, or some other suitable data processing system.

As depicted, controller 116 monitors a first group of motor parameters 124 and a second group of external bias parameters 126 in sensor data 118 generated by sensor system 114. Controller 116 is in communication with sensor system 114 and receives sensor data 118 containing information for these parameters.

In the illustrative example, the first group of motor parameters 124 is for the environment affected by the operation of motor 108 in aircraft 102. In the illustrative example, the first group of motor parameters 124 may be selected from at least one of an input pressure into the motor, an output pressure for the motor, a motor temperature, a bearing temperature, motor vibrations, a motor noise, a motor torque, a motor voltage, a motor current, or some other suitable parameter about the environment that may be affected by the operation of motor 108.

For example, heat from motor 108 is detected as a motor temperature. As another example, the motor current is the current drawn by motor 108 through one or more wires in the environment around the motor when motor 108 operates.

The second group of external bias parameters 126 modifies an effect the first group of motor parameters 124 has in identifying health 106 of motor 108 by controller 116. As depicted, the second group of external bias parameters 126 is selected from one of a command input, an altitude, an ambient temperature, a voltage source, ram air pressure, ambient vibrations, an aircraft line voltage, an ambient noise, or some other suitable parameter that has an effect on one or more of the first group of motor parameters 124.

As depicted, with these parameters received in sensor data 118 from sensor system 114, controller 116 identifies health 106 of motor 108 based on the first group of motor parameters 124 and the second group of external bias parameters 126. In this illustrative example, controller 116 performs action 128 based on health 106 of motor 108 as identified by controller 116. In one illustrative example, action 128 is selected from at least one of determining whether motor 108 is operating as desired, undesired operating condition 112 is present for motor 108, or predicting when undesired operating condition 112 will be present for motor 108. When motor 108 is operating as desired, a desired operating condition is present for motor 108.

In another illustrative example, when undesired operating condition 112 is present, action 128 may be selected from at least one of generating a log entry, sending a message indicating the health of the motor, generating an alert in the aircraft, sending a request for maintenance, ceasing operation of the motor, recording data for the first group of motor parameters, recording data for the second group of bias parameters, sending a message indicating a confidence level for a fused likelihood of the undesired operating condition, sending a message indicating the health of the motor at a future time, or some other suitable action. In another illustrative example, action 128 may be to take no action. In this manner, controller 116 enables increasing confidence level 130 in indicating health 106 of motor 108. As depicted, health 106 of motor 108 may be selected from at least one of a current health of motor 108 and a predicted health of motor 108 at a future point in time.

For example, health 106 may be a current health of aircraft 102 that indicates whether undesired operating condition 112 is present in motor 108. The current health may be used to determine if action 128 should be taken with respect to motor 108 at the time health 106 is identified.

In another illustrative example, health 106 may be a predicted health for aircraft 102. When health 106 is a predicted health, health 106 may indicate when undesired operating condition 112 may occur at some future point in time. Predicted health may be used to determine if an action is needed immediately or if an action can be taken later. For example, turning off motor 108 may reduce maintenance of motor 108 later. The predicted health may also be used to schedule maintenance of motor 108 after one or more flights of aircraft 102.

With an increase in confidence level 130 in identifying health 106 of motor 108 by health management system 104, fewer false positives in indicating a presence of undesired operating condition 112, current or future, for motor 108 may occur as compared to currently used techniques for identifying health 106 of motor 108. As a result, the technical issue with the management of health 106 of motor 108 is solved using health management system 104.

Figure 2:
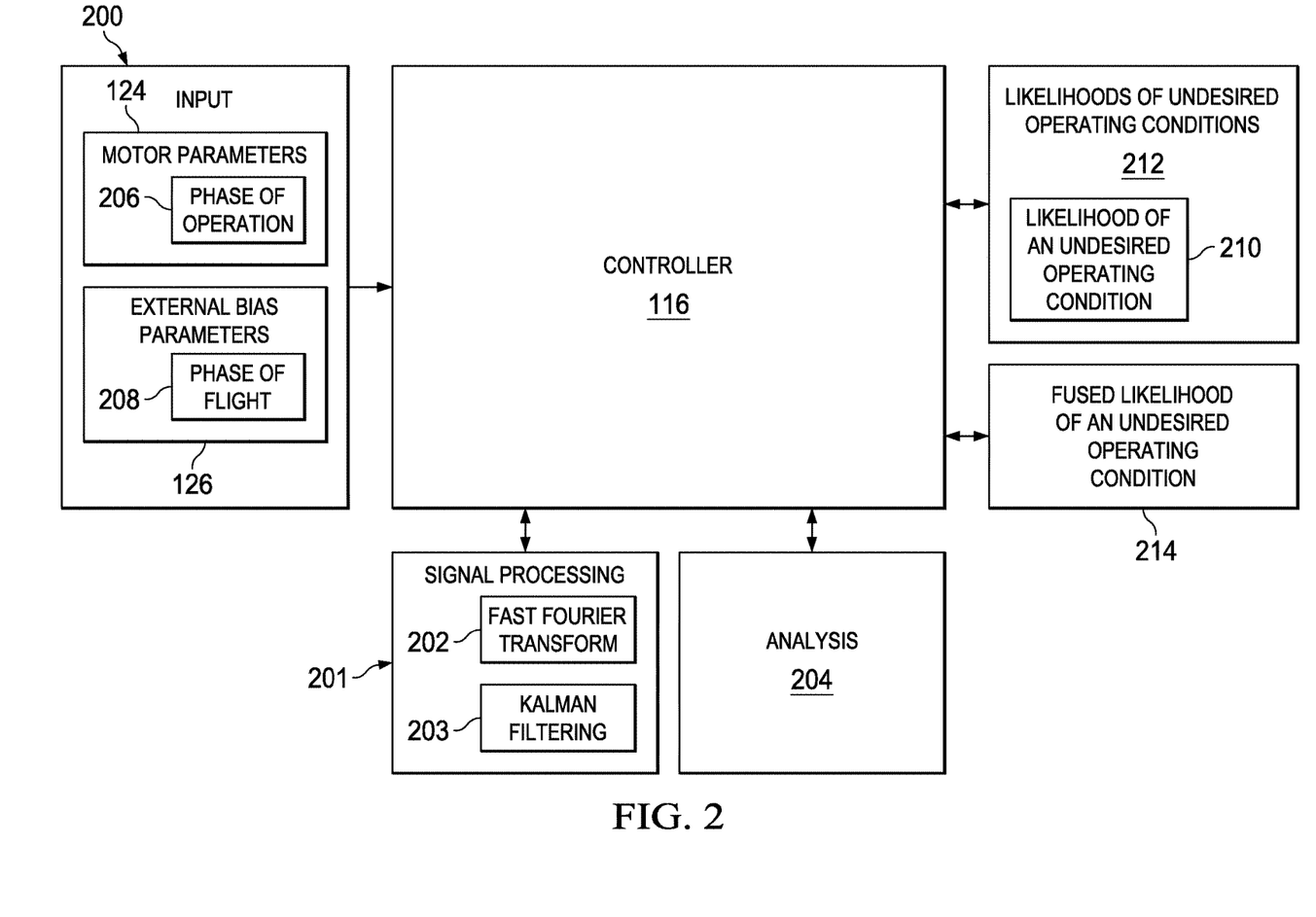
FIG. 2 is an illustration of a block diagram of a data flow for identifying the health of a motor in accordance with an illustrative embodiment.

With reference next to FIG. 2, an illustration of a block diagram of a data flow for identifying the health of a motor is depicted in accordance with an illustrative embodiment. In this example, controller 116 receives the first group of motor parameters 124 and the second group of external bias parameters 126 as input 200 for identifying health 106 of motor 108 in FIG. 1. In the illustrative examples, the same reference numeral may be used in more than one figure. This reuse of the reference numeral in different figures represents the same element being present in the different figures.

In the illustrative example, the second group of external bias parameters 126 is taken into account anytime aircraft conditions impact motor sensor readings that generate the first group of motor parameters 124. In the illustrative example, the second group of external bias parameters 126 may be taken into account through signal processing. The signal processing may include, for example, filtering aircraft vibrations out of the vibration sensor values to isolate motor vibrations. Another illustrative example is the impact that aircraft temperature has on pressure rise in the motor. In another illustrative example, the aircraft line voltage fluctuations may be used to explain current spikes or slow start up times in the motor.

As depicted in this illustrative example, controller 116 may perform signal processing 201 on the first group of motor parameters 124. Signal processing 201 may include techniques such as, for example, Fast Fourier Transform (FFT) 202 or Kalman filtering 203. As depicted, the first group of motor parameters 124 is placed into a frequency domain to perform analysis 204 in identifying health 106 for motor 108 in FIG. 1.

Analysis 204 may be performed for at least one of phase of operation 206 of motor 108 or phase of flight 208 of aircraft 102 in FIG. 1. As depicted, the first group of motor parameters 124 may change based on phase of operation 206. In the illustrative example, phase of operation 206 of motor 108 may be selected from one of startup, steady state, power down, or some other phase of operation for motor 108. The second group of external bias parameters 126 may change based on phase of flight 208. In the illustrative example, phase of flight 208 may be selected from one of, and wherein the phase of operation of aircraft 102 is selected from one of take-off, ascent, cruising, descent, taxiing, or some other phase of flight that may occur for aircraft 102. In particular, controller 116 identifies, in this illustrative example, health 106 of motor 108 based on the first group of motor parameters 124, the second group of external bias parameters 126, phase of operation 206 of motor 108, and phase of flight 208 of aircraft 102 in FIG. 1.

As depicted, in analysis 204, controller 116 identifies likelihood of an undesired operating condition 210. In the illustrative example, likelihood of undesired operating condition 210 is identified by controller 116 for a first parameter in the first group of motor parameters 124 taking into account a second parameter in the second group of external bias parameters 126. The second parameter in the second group of external bias parameters 126 is a parameter that affects the first parameter in the first group of motor parameters 124. This identification is performed for each of the first group of parameters taking into account the associated parameters in the second group of external bias parameters 126.

Controller 116 performs these operations to identify likelihoods of undesired operating conditions 212 based on the first group of motor parameters 124 taking into account the second group of external bias parameters 126. As part of analysis 204, controller 116 combines likelihoods of undesired operating conditions 212 into fused likelihood of an undesired operating condition 214. In particular, controller 116 identifies likelihoods of undesired operating conditions 212 based on first group of motor parameters 124 taking into account second group of external bias parameters 126 and combines likelihoods of undesired operating conditions 212 using confidence factors for sensors 120 to form fused likelihood of an undesired operating condition 214.

In the illustrative example, fused likelihood of an undesired operating condition 214 is one manner in which health 106 for motor 108 in FIG. 1 may be identified. Analysis 204 may be performed to take into account differences in motor 108 for different phases of operation and different biases that affect the identification of health 106 that occur during different phases of flight of aircraft 102. As depicted, fused likelihood of an undesired operating condition 214 may be performed for each of phase of operation 206 for phase of flight 208 that is present for phase of operation 206. As a result, health 106 may be identified with a higher confidence level as compared to current techniques for identifying health 106 for motor 108.

The illustration of health management environment 100 and the different components in health management environment 100 illustrated in FIG. 1 and FIG. 2 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, controller 116 is located in aircraft 102 in the depicted example. In another illustrative example, controller 116 may be distributed in more than one location. For example, a portion of controller 116 may be located in aircraft 102 and another portion of controller 116 may be located in a ground location. The ground location may be an airline control center, a maintenance location, or some other suitable location. As another example, in addition to identifying a presence of an undesired operating condition, controller 116 may also identify a desired operating condition for the motor in identifying health 106 of motor 108 based on the first group of motor parameters 124 and the second group of external bias parameters 126.

Figure 3:
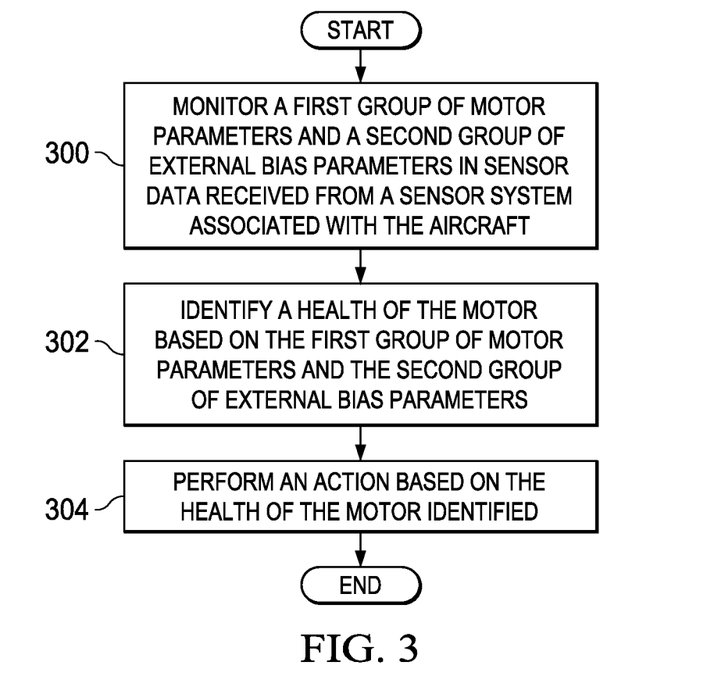
FIG. 3 is an illustration of a high-level flowchart of a process for managing the health of the motor in accordance with an illustrative embodiment.

With reference next to FIG. 3, an illustration of a high-level flowchart of a process for managing the health of the motor is depicted in accordance with an illustrative embodiment. The process illustrated in FIG. 3 may be implemented in health management system 104 in FIG. 1. One or more of the operations may be implemented in controller 116 as shown in FIG. 1 and FIG. 2.

The process begins by monitoring a first group of motor parameters and a second group of external bias parameters in sensor data received from a sensor system associated with the aircraft (operation 300). In operation 300, the first group of motor parameters is for the environment affected by the operation of a motor in the aircraft and the second group of external bias parameters modifies an effect the first group of motor parameters has in identifying the health of the motor.

The process then identifies a health of the motor based on the first group of motor parameters and the second group of external bias parameters (operation 302). In operation 302, the health of the motor may be identified based on the first group of motor parameters, the second group of external bias parameters, a phase of operation of the motor, and a phase of flight of the aircraft.

The process then performs an action based on the health of the motor identified (operation 304), with the process terminating thereafter. The process enables increasing a confidence level in indicating a health of the motor.

Figure 4:
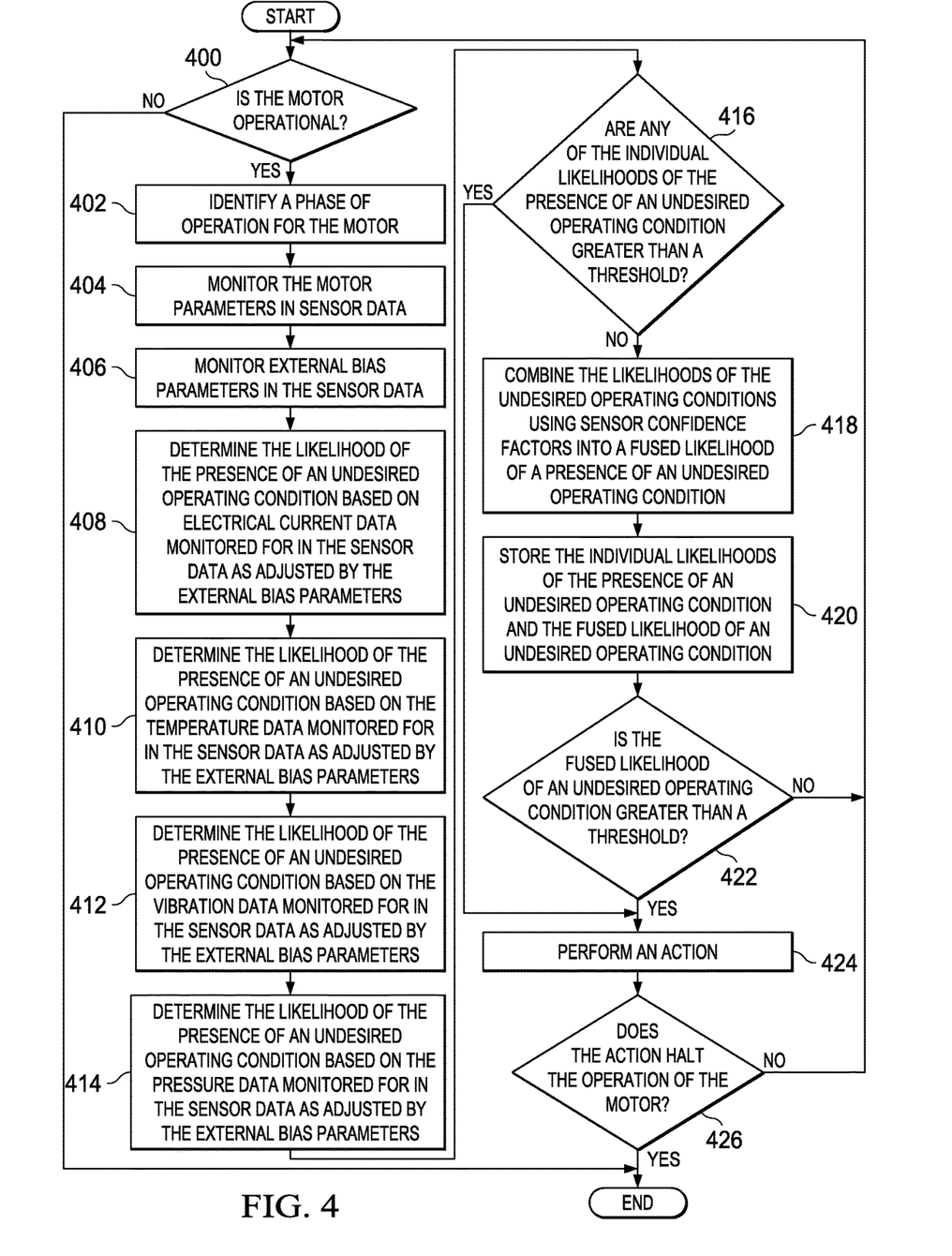
FIG. 4 is an illustration of a flowchart of a process for managing a motor in an aircraft in accordance with an illustrative embodiment.

Turning next to FIG. 4, an illustration of a flowchart of a process for managing a motor in an aircraft is depicted in accordance with an illustrative embodiment. The process depicted in FIG. 4 may be implemented in health management system 104 in FIG. 1. One or more of the operations may be implemented in controller 116 as shown in FIG. 1 and FIG. 2. As depicted, the flowchart in FIG. 4 illustrates one manner in which an analysis to identify the health of a motor may be performed. In this illustrative example, the different operations are described with the motor taking the form of a fan.

The process begins by determining whether the motor is operational (operation 400). If the motor is not operational, the process terminates.

Otherwise, the process identifies a phase of operation for the motor (operation 402). The phase of operation may be, for example, start up, steady-state, shut down, or some other suitable phase of operation of the motor may enter.

The process then monitors motor parameters in sensor data (operation 404). As depicted, the process monitors the vibration, current, pressure, and bearing temperature in the sensor data generated by the sensor system.

In the illustrative example, the process also monitors external bias parameters in the sensor data (operation 406). These external bias parameters are parameters that may need to be compensated for in the motor parameters that are monitored in operation 404. In operation 406, external bias parameters may include altitude, temperature, vibration, electromagnetic interference, or other suitable parameters. For example, altitude may affect the pressure measured around the fan. The temperature around the fan blade affects the bearing temperature measured for the same. Vibrations in the aircraft may affect the vibrations detected by the accelerometer for the motor. Electromagnetic interference may affect the current detected for the fan. Aircraft voltage levels may affect the current in the motor. Air density may affect the current in the motor when the motor turns a fan.

The process then determines the likelihood of the presence of an undesired operating condition based on electrical current data monitored for in the sensor data as adjusted by the external bias parameters (operation 408). In this example, the electrical current data is an example of a motor parameter. In the illustrative example, external bias parameters may include known or measured electromagnetic interference from other sources near the motor.

Next, the process determines the likelihood of the presence of an undesired operating condition based on the temperature data monitored for in the sensor data as adjusted by the external bias parameters (operation 410). The temperature data is another example of a motor parameter. The process then determines the likelihood of the presence of an undesired operating condition based on the vibration data monitored for the sensor data as adjusted by the external bias parameters (operation 412).

Vibration data is another example of a motor parameter that may be monitored for in the sensor data. The process also determines the likelihood of the presence of an undesired operating condition based on the pressure data monitored for in the sensor data as adjusted by the external bias parameters (operation 414).

The process in operation 414 identifies a likelihood of an undesired operating condition being present based on the pressure data adjusted by the external ambient air pressure, internal cabin pressure, external ambient temperature data, and internal cabin temperature impacting the input and output parameters of the motor generated during the operation of the motor.

A determination is made as to whether any of the individual likelihoods of the presence of an undesired operating condition are greater than a threshold (operation 416). Each particular type of sensor data may have a different threshold.

If any of the individual sensor readings are not greater than a threshold for the sensor, the process combines the likelihoods of the undesired operating conditions using sensor confidence factors into a fused likelihood of a presence of an undesired operating condition (operation 418). In operation 418, the process identifies the confidence factor for the current data as 0.3 and the confidence factor for the temperature data as 0.3. The confidence factor for the pressure data is 0.2 and the confidence factor for the accelerometer data is 0.2. In this example, failure likelihoods are assigned as current data failure likelihood of 70%, temperature data failure likelihood of 25%, pressure data failure likelihood of 50%, and accelerometer data failure likelihood of 57.5%. The operational fused likelihood of an undesired operating condition is identified by combining the confidence levels for the sensors as follows:

$$0.3*70\%+0.3*25\%+0.2*50\%+0.2*57.5\%=50\%.$$

The process then stores the individual likelihoods of the presence of an undesired operating condition and the fused likelihood of an undesired operating condition (operation 420). In this manner, historical data may be generated for operational fused likelihood of an undesired operating condition.

Next, the process determines whether the fused likelihood of an undesired operating condition greater than a threshold (operation 422). As depicted, operation 422 is a diagnostic operation. If the operational fused likelihood of an undesired operating condition is not greater than the threshold, the process returns to operation 400. Otherwise, if the operational fused likelihood of an undesired operating condition is greater than a threshold, the process performs an action (operation 424).

After performing the action, the process determines whether the action halts the operation of the motor (operation 426). If the action halts the operation of the motor, the process terminates. Otherwise, the process returns to operation 400 as described above. With reference again to operation 416, if any of the individual sensor readings are greater than a threshold for the sensor, the process proceeds to operation 424 to perform an action as described above.

Figure 5:
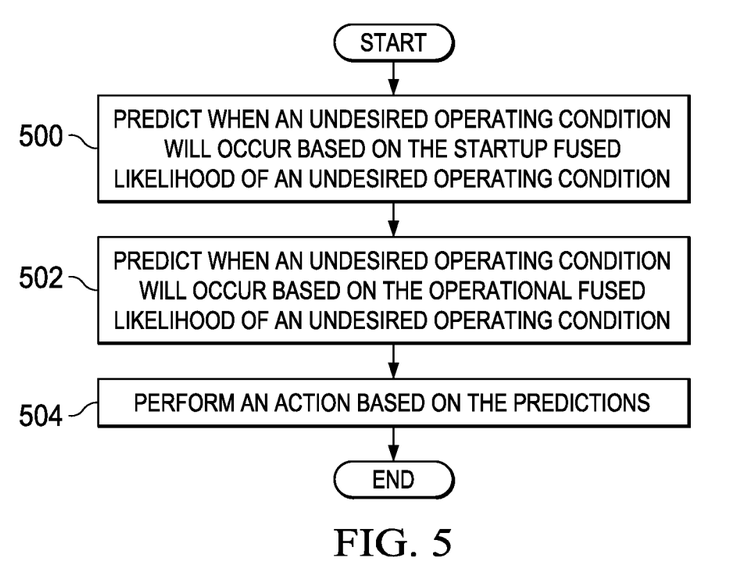
FIG. 5 is an illustration of a flowchart of a process for predicting a likelihood of an undesired operating condition at a future point in time in accordance with an illustrative embodiment.

Turning now to FIG. 5, an illustration of a flowchart of a process for predicting a likelihood of an undesired operating condition at a future point in time is depicted in accordance with an illustrative embodiment. The process illustrated in FIG. 5 may be implemented in controller 116 in FIG. 1. Alternatively, this process may also be implemented in a computer or other data processing system in computer system 122 that may be located in aircraft 102 or some other remote location.

The process begins by predicting when an undesired operating condition will occur based on the startup fused likelihood of an undesired operating condition (operation 500). The process predicts when an undesired operating condition will occur based on the operational fused likelihood of an undesired operating condition (operation 502).

The predictions made in operation 500 and operation 502 may be based on time, number of flights, or some other measure. For example, with the fan described in the flowchart in FIG. 4, a likelihood of an undesired condition occurring increases over time or use of the fan. For example, this likelihood should increase over time in approach to the fused likelihood failure threshold from operation 422. A prediction may be made based on comparing the increase in the likelihood of the undesired operating condition as compared to historical or other data.

For example, with a fused failure likelihood threshold of 60%, and a linear growth of historical fused failure likelihoods of 25% 5 months ago, 30% 4 months ago, 35% 3 months ago, 40% 2 months ago, 45% one month ago, and 50% today, a prediction of when the fused failure likelihood threshold of 60% will be reached is in 2 months by using a linear growth model with 55% one month into the future and 60% 2 months into the future.

The process then performs an action based on the predictions (operation 504), with the process terminating thereafter. In operation 504, the action may take various forms. For example, the action may include generating an alert, storing the prediction in a log, sending the prediction to a maintenance center, scheduling maintenance based on the prediction of when the undesired operating condition is likely to occur, or some other suitable action.

Figure 6:
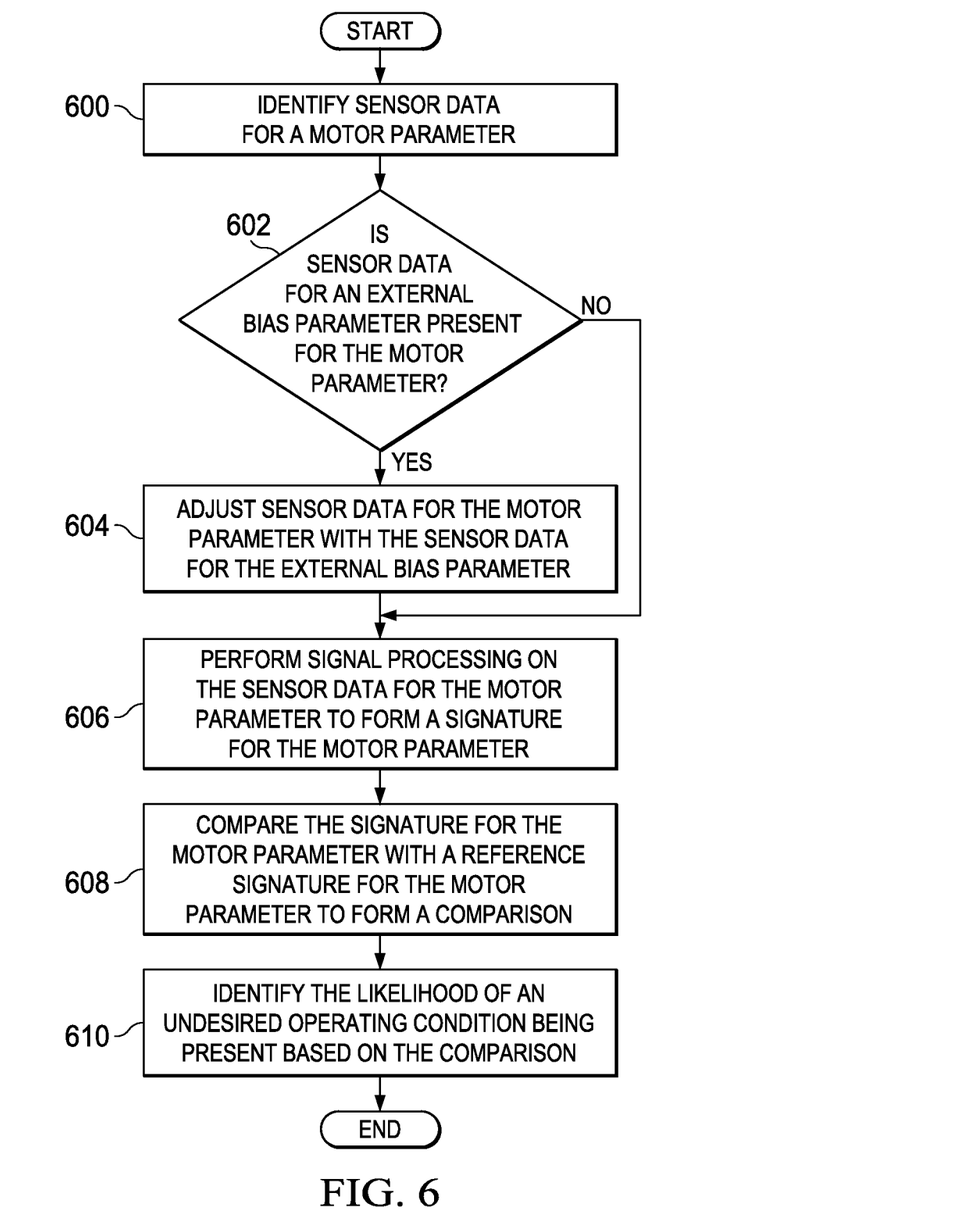
FIG. 6 is an illustration of a flowchart of a process for identifying a likelihood that an undesired operating condition is present using a parameter in accordance with an illustrative embodiment.

Turning now to FIG. 6, an illustration of a flowchart of a process for identifying a likelihood that an undesired operating condition is present using a parameter is depicted in accordance with an illustrative embodiment. The process illustrates one manner in which an identification of a likelihood that an undesired operating condition is present may be made in operation 408, operation 410, operation 412, and operation 414 in FIG. 4.

The process identifies sensor data for a motor parameter (operation 600). The process then determines whether sensor data for an external bias parameter is present for the motor parameter (operation 602). In some cases, the motor parameter may not have an external bias parameter that affects the motor parameter. Also, the external bias parameter may not be used during some phases of operation of the motor or some phases of flight of the aircraft.

If sensor data for the external bias parameter is present, the process adjusts the sensor data for the motor parameter with the sensor data for the external bias parameter (operation 604). The process then performs signal processing on the sensor data for the motor parameter to form a signature for the motor parameter (operation 606). In the illustrative example, the signal processing may be performed using at least one of a Fast Fourier Transform, a Kalman filter, or some other suitable signal processing technique. With reference again to operation 602, if sensor data for an external bias parameter for the motor parameter is not present, the process proceeds to operation 606 as described above.

The process then compares the signature for the motor parameter with a reference signature for the motor parameter to form a comparison (operation 608). The reference signature may be an expected signature for the motor parameter. This reference signature may be for at least one of a particular phase of operation of the motor or a phase of flight for the aircraft. For example, different phases of operation may have different expected values for the sensor data for the motor parameter. Also, different phases of flight may result in different adjustments to the sensor data for the motor parameter, resulting in a different signature for the phase of flight even though the phase of operation may not change for the motor.

The process then identifies the likelihood of an undesired operating condition being present based on the comparison (operation 610), with the process terminating thereafter. In operation 610, the likelihood of an undesired operating condition being present increases as the difference between the signature for the motor parameter and the reference signature increases.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, the process described in the flowchart in FIG. 4 uses sensor data for motor parameters such as current, vibration, pressure, and bearing temperature. Other motor parameters may be used in addition to or in place of the ones illustrated in FIG. 4. For example, torque, revolutions per minute (RPM), or other suitable motor parameters also may be used in addition to or in place of the ones depicted in FIG. 4.

In another illustrative example, only a single prediction may be performed in the flowchart in FIG. 5. For example, the prediction may be performed for startup or operation of the motor.

Figure 7:
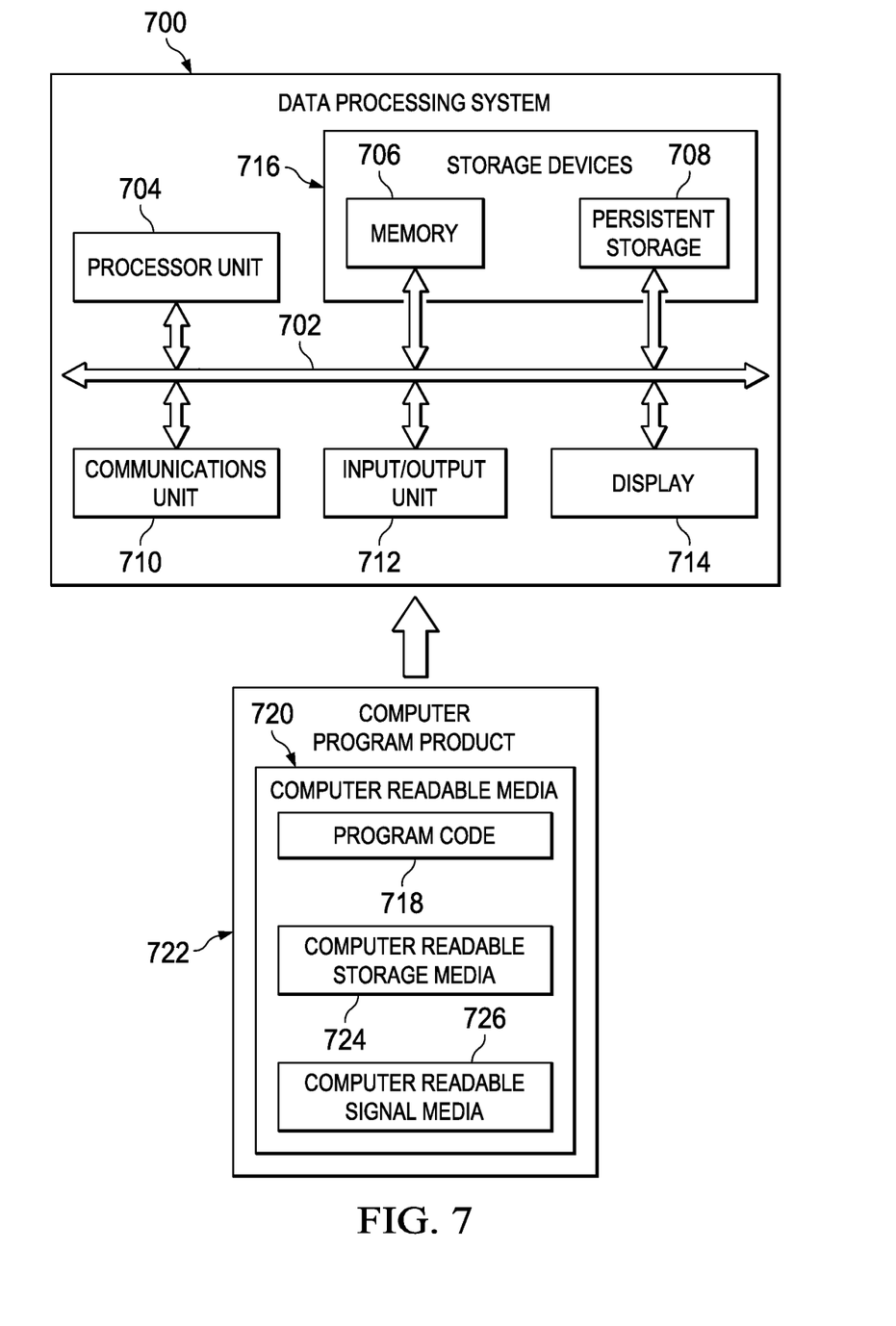
FIG. 7 is an illustration of a block diagram of a data processing system in accordance with an illustrative embodiment.

Turning now to FIG. 7, an illustration of a block diagram of a data processing system is depicted in accordance with an illustrative embodiment. Data processing system 700 may be used to implement computer system 122 in FIG. 1. In this illustrative example, data processing system 700 includes communications framework 702, which provides communications between processor unit 704, memory 706, persistent storage 708, communications unit 710, input/output (I/O) unit 712, and display 714. In this example, communications framework 702 may take the form of a bus system.

Processor unit 704 serves to execute instructions for software that may be loaded into memory 706. Processor unit 704 may be a number of processors, a multi-processor core, or some other type of processor, depending on the particular implementation.

Memory 706 and persistent storage 708 are examples of storage devices 716. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 716 may also be referred to as computer readable storage devices in these illustrative examples. Memory 706 in these examples may be, for example, a random access memory (RAM) or any other suitable volatile or non-volatile storage device. Persistent storage 708 may take various forms, depending on the particular implementation.

For example, persistent storage 708 may contain one or more components or devices. For example, persistent storage 708 may be a hard drive, a flash memory, a rewritable optical disk, a rewritable magnetic tape, or some combination of the above. The media used by persistent storage 708 also may be removable. For example, a removable hard drive may be used for persistent storage 708.

Communications unit 710, in these illustrative examples, provides for communications with other data processing systems or devices. In these illustrative examples, communications unit 710 is a network interface card.

Input/output unit 712 allows for input and output of data with other devices that may be connected to data processing system 700. For example, input/output unit 712 may provide a connection for user input through at least of a keyboard, a mouse, or some other suitable input device. Further, input/output unit 712 may send output to a printer. Display 714 provides a mechanism to display information to a user.

Instructions for at least one of the operating system, applications, or programs may be located in storage devices 716, which are in communication with processor unit 704 through communications framework 702. The processes of the different embodiments may be performed by processor unit 704 using computer-implemented instructions, which may be located in a memory, such as memory 706.

These instructions are referred to as program code, computer usable program code, or computer readable program code that may be read and executed by a processor in processor unit 704. The program code in the different embodiments may be embodied on different physical or computer readable storage media, such as memory 706 or persistent storage 708.

Program code 718 is located in a functional form on computer readable media 720 that is selectively removable and may be loaded onto or transferred to data processing system 700 for execution by processor unit 704. Program code 718 and computer readable media 720 form computer program product 722 in these illustrative examples. In one example, computer readable media 720 may be computer readable storage media 724 or computer readable signal media 726. In these illustrative examples, computer readable storage media 724 is a physical or tangible storage device used to store program code 718 rather than a medium that propagates or transmits program code 718.

Alternatively, program code 718 may be transferred to data processing system 700 using computer readable signal media 726. Computer readable signal media 726 may be, for example, a propagated data signal containing program code 718. For example, computer readable signal media 726 may be at least one of an electromagnetic signal, an optical signal, or any other suitable type of signal. These signals may be transmitted over at least one of communications links such as wireless communications links, optical fiber cables, coaxial cables, wires, or any other suitable types of communications links.

The different components illustrated for data processing system 700 are not meant to provide architectural limitations to the manner in which different embodiments may be implemented. The different illustrative embodiments may be implemented in a data processing system including components in addition to or in place of those illustrated for data processing system 700. Other components shown in FIG. 7 can be varied from the illustrative examples shown. The different embodiments may be implemented using any hardware device or system capable of running program code 718.

Figure 8:
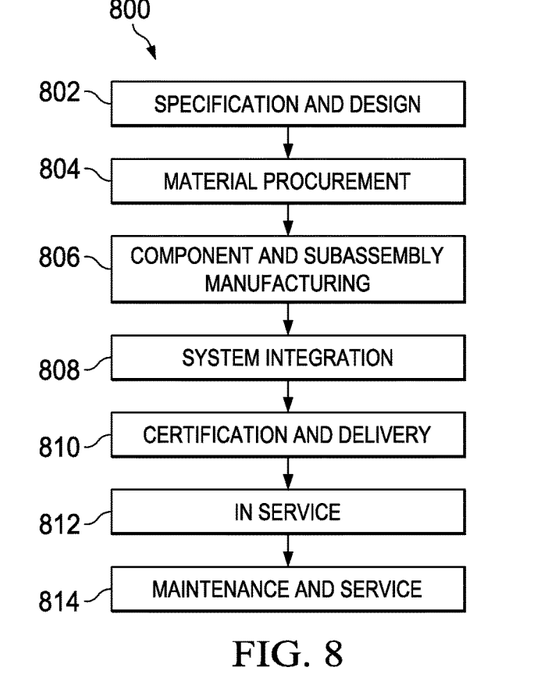
FIG. 8 is an illustration of an aircraft manufacturing and service method in the form of a block diagram in accordance with an illustrative embodiment.
Figure 9:
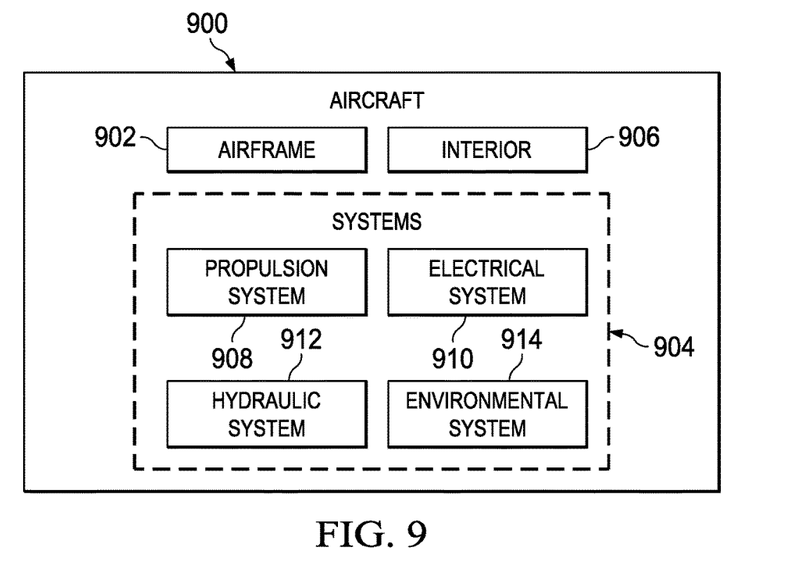
FIG. 9 is an illustration of an aircraft in the form of a block diagram in which an illustrative embodiment may be implemented.

Illustrative embodiments of the disclosure may be described in the context of aircraft manufacturing and service method 800 as shown in FIG. 8 and aircraft 900 as shown in FIG. 9. Turning first to FIG. 8, an illustration of an aircraft manufacturing and service method is depicted in the form of a block diagram in accordance with an illustrative embodiment. During pre-production, aircraft manufacturing and service method 800 may include specification and design 802 of aircraft 900 in FIG. 9 and material procurement 804.

During production, component and subassembly manufacturing 806 and system integration 808 of aircraft 900 in FIG. 9 takes place. Thereafter, aircraft 900 in FIG. 9 may go through certification and delivery 810 in order to be placed in service 812. While in service 812 by a customer, aircraft 900 in FIG. 9 is scheduled for routine maintenance and service 814, which may include modification, reconfiguration, refurbishment, and other maintenance or service.

Each of the processes of aircraft manufacturing and service method 800 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 9, an illustration of an aircraft is depicted in the form of a block diagram in which an illustrative embodiment may be implemented. In this example, aircraft 900 is produced by aircraft manufacturing and service method 800 in FIG. 8 and may include airframe 902 with plurality of systems 904 and interior 906. Examples of systems 904 include one or more of propulsion system 908, electrical system 910, hydraulic system 912, and environmental system 914. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 800 in FIG. 8. For example, health management system 104 in FIG. 1 may be implemented in the design of aircraft 900 during specification and design 802. In another illustrative example, a health management system may be added to aircraft 900 during system integration 808. In still another illustrative example, an existing health management system may be modified to include a controller to monitor motors during maintenance and service 814. This addition may take place during upgrades, routine maintenance, or refurbishment of aircraft 900 during maintenance and service 814.

In one illustrative example, components or subassemblies produced in component and subassembly manufacturing 806 in FIG. 8 may be fabricated or manufactured in a manner similar to components or subassemblies produced while aircraft 900 in FIG. 9 is in service 812 in FIG. 8. As yet another example, one or more apparatus embodiments, method embodiments, or a combination thereof may be utilized during production stages, such as component and subassembly manufacturing 806 and system integration 808 in FIG. 8. One or more apparatus embodiments, method embodiments, or a combination thereof may be utilized while aircraft 900 is in service 812, during maintenance and service 814 in FIG. 8, or both. The use of a number of the different illustrative embodiments may substantially expedite the assembly of aircraft 900, reduce the cost of aircraft 900, or both expedite the assembly of aircraft 900 and reduce the cost of aircraft 900.

Thus, the illustrative examples may be used to increase the confidence level in indicating the health of the motor. This health may be used to perform diagnostic operations such as whether to continue to use the motor. In these illustrative examples, the health may be expressed as a likelihood of the presence of an undesired operating condition.

Additionally, the indication of the health may also be used to predict when maintenance may be needed for the motor. This maintenance may be described in terms of time, number of flights, number of motor startups, or in some other suitable manner.

In the illustrative examples, the identification of the health of the motor may be performed using sensor data already generated by an existing sensor system in the aircraft. In other words, the addition of new sensors may not be necessary to implement a health management system in accordance with an illustrative embodiment.

Further, as described above, a confidence level may be increased through using sensor motor parameters and external bias parameters in the sensor data. In this manner, adjustments may be made to the sensor data for motor parameters using external bias parameters for the environment around the motor. Further, the different illustrative examples also take into account changes in external bias parameters that occur during different phases of flight of an aircraft.

The description of the different illustrative embodiments has been presented for purposes of illustration and description, and is not intended to be exhaustive or limited to the embodiments in the form disclosed. Many modifications and variations will be apparent to those of ordinary skill in the art.

The different illustrative examples describe components that perform actions or operations. In an illustrative embodiment, a component is configured to perform the action or operation described. For example, the component may have a configuration or design for a structure that provides the component an ability to perform the action or operation that is described in the illustrative examples as being performable by the component.

Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a sensor system for an aircraft; and
a controller that monitors a first group of motor parameters and a second group of external bias parameters in sensor data generated by the sensor system in which the first group of motor parameters is for an environment affected by operation of a motor in the aircraft and the second group of external bias parameters modifies an effect of the first group of motor parameters in identifying a health of the motor; identifies the health of the motor based on the first group of motor parameters, the second group of external bias parameters, confidence factors for sensors in the sensor system, a phase of operation of the motor, and a phase of flight of the aircraft; and controls operation of the motor based on the health of the motor identified.

2. The apparatus of claim 1, wherein identifying the health of the motor is selected from at least one of determining whether an undesired operating condition is present for the motor or predicting when the undesired operating condition will be present for the motor.

3. The apparatus of claim 2, wherein when the undesired operating condition is present, the controller controls the operation of the motor by ceasing the operation of the motor.

4. The apparatus of claim 2, wherein the undesired operating condition is selected from one of an undesired level of performance for the motor or the motor is unable to operate.

5. The apparatus of claim 2, wherein in identifying the health of the motor, the controller identifies a desired operating condition for the motor.

6. The apparatus of claim 1, wherein in identifying the health of the motor, the controller identifies the confidence factors for the sensors for likelihoods of undesired operating conditions based on the first group of motor parameters taking into account the second group of external bias parameters and combines the likelihoods of the undesired operating conditions using the confidence factors for the sensors into a fused likelihood of an undesired operating condition.

7. The apparatus of claim 6, wherein the likelihood of the undesired operating condition is identified for the phase of operation of the motor.

8. The apparatus of claim 7, wherein the likelihood of the undesired operating condition occurring during the phase of operation of the motor is identified based on signal processing of the first group of motor parameters.

9. The apparatus of claim 1, wherein the phase of operation of the motor is selected from one of startup, steady state, or power down, and wherein the phase of operation of the aircraft is selected from one of take-off, ascent, cruising, descent, and taxiing.

10. The apparatus of claim 1, wherein the sensor system comprises at least one of a temperature sensor, an accelerometer, a pressure sensor, a microphone, a strain gauge, a voltage sensor, a torque sensor, or a current sensor.

11. The apparatus of claim 1, wherein the first group of motor parameters is selected from at least one of an input pressure into the motor, an output pressure for the motor, a motor temperature, a bearing temperature, motor vibrations, motor noise, motor torque, motor voltage, or motor current.

12. The apparatus of claim 1, wherein the second group of external bias parameters is selected from one of a command input, an altitude, an ambient temperature, a voltage source, ram air pressure, ambient vibrations, an aircraft line voltage, or ambient noise.

13. The apparatus of claim 1, wherein the motor is selected from one of an electric motor, a fan, a pump, an actuator, a hydraulic motor, a pneumatic motor, and a rotary motor.

14. A method for controlling operation of a motor in an aircraft, the method comprising:
monitoring a first group of motor parameters and a second group of external bias parameters in sensor data received from a sensor system associated with the aircraft in which the first group of motor parameters is for an environment affected by operation of the motor in the aircraft and the second group of external bias parameters modifies an effect of the first group of motor parameters in identifying a health of the motor;

identifying the health of the motor based on the first group of motor parameters, the second group of external bias parameters, confidence factors for sensors in the sensor system a phase of operation of the motor, and a phase of operation of the aircraft; and controlling operation of the motor based on the health of the motor identified.

15. The method of claim 14, wherein identifying the health of the motor comprises:

identifying likelihoods of undesired operating conditions based on the first group of motor parameters taking into account the second group of external bias parameters and combining the likelihoods of the undesired operating conditions using the confidence factors for the sensors to form a fused likelihood of an undesired operating condition.

16. The method of claim 15, wherein a likelihood of the undesired operating condition is identified for the phase of operation of the motor.

17. The method of claim 16, wherein the likelihood of the undesired operating condition occurring during the phase of operation of the motor is identified based on signal processing of the first group of motor parameters.

18. The method of claim 14, wherein identifying the health of the motor is selected from at least one of determining whether a desired operating condition or an undesired operating condition is present for the motor, or predicting when the undesired operating condition will be present for the motor.

* * * * *